United States Patent
Tang et al.

(10) Patent No.: US 8,624,368 B2
(45) Date of Patent: Jan. 7, 2014

(54) QUAD FLAT NON-LEADED SEMICONDUCTOR PACKAGE

(75) Inventors: Fu-Di Tang, Taichung (TW);
Ching-Chiuan Wei, Taichung (TW);
Yung-Chih Lin, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 287 days.

(21) Appl. No.: 12/843,440

(22) Filed: Jul. 26, 2010

(65) Prior Publication Data

US 2011/0221049 A1   Sep. 15, 2011

(30) Foreign Application Priority Data

Mar. 12, 2010   (TW) .............................. 99107207 A

(51) Int. Cl.
*H01L 23/28* (2006.01)

(52) U.S. Cl.
USPC ..... 257/676; 257/787; 257/790; 257/E23.037

(58) Field of Classification Search
USPC ........................................................ 257/676
See application file for complete search history.

(56) References Cited

U.S. PATENT DOCUMENTS

| | | |
|---|---|---|
| 5,830,800 A | 11/1998 | Lin |
| 6,238,952 B1 | 5/2001 | Lin |
| 6,261,864 B1 | 7/2001 | Jung et al. |
| 6,306,685 B1 | 10/2001 | Liu et al. |
| 6,635,957 B2 | 10/2003 | Kwan et al. |
| 6,930,377 B1 * | 8/2005 | Bayan ........................... 257/684 |
| 7,482,690 B1 * | 1/2009 | Fan et al. ...................... 257/724 |
| 2009/0243054 A1 * | 10/2009 | Yeung et al. .................. 257/666 |

* cited by examiner

*Primary Examiner* — Thanh Nguyen
(74) *Attorney, Agent, or Firm* — Edwards Wildman Palmer LLP; Peter F. Corless; Steven M. Jensen

(57) ABSTRACT

A Quad Flat No-Lead (QFN) semiconductor package includes a die pad; I/O connections disposed at the periphery of the die pad; a chip mounted on the die pad; bonding wires; an encapsulant for encapsulating the die pad, the I/O connections, the chip and the bonding wires while exposing the bottom surfaces of the die pad and the I/O connections; a surface layer formed on the bottoms surfaces of the die pad and the I/O connections; a dielectric layer formed on the bottom surfaces of the encapsulant and the surface layer and having openings for exposing the surface layer. The surface layer has good bonding with the dielectric layer that helps to prevent solder material in a reflow process from permeating into the die pad and prevent solder extrusion on the interface of the I/O connections and the dielectric layer, thereby increasing product yield.

8 Claims, 5 Drawing Sheets

QUAD FLAT NON-LEADED SEMICONDUCTOR PACKAGE

CROSS-REFERENCES TO RELATED APPLICATIONS

This application claims under 35 U.S.C. §119(a) the benefit of Taiwanese Application No. 099107207 filed Mar. 12, 2010, the entire contents of which is incorporated herein by reference.

BACKGROUND OF THE INVENTION

1. Field of the Invention

The present invention relates generally to quad flat non-leaded (QFN) semiconductor packages, and more particularly, to a QFN semiconductor package capable of preventing solder extrusion and a method for fabricating the same.

2. Description of Related Art

In a QFN semiconductor package having a die pad and a plurality of leads, the bottom surfaces of the die pad and the leads are exposed from the semiconductor package such that the semiconductor package can be coupled to a printed circuit board through surface mount techniques, thereby forming a circuit module with a specific function. During such a surface mount process, the die pad and leads of the QFN semiconductor package are directly soldered to the printed circuit board.

As disclosed by U.S. Pat. No. 6,238,952, U.S. Pat. No. 6,261,864 and U.S. Pat. No. 6,306,685, a conventional QFN semiconductor package 8 is shown in FIG. 8.

The QFN semiconductor package 8 comprises: a lead frame 81 having a die pad 811 and a plurality of leads 813; a chip 83 mounted on the die pad 811; a plurality of bonding wires 84 electrically connecting to the chip 83 and the leads 813; and an encapsulant 85 encapsulating the chip 83, the bonding wires 84 and the lead frame 81, wherein the die pad 811 and the leads 813 protrude from the encapsulant 85 since the die pad 811 and the leads 813 are directly formed from a metal carrier by etching. Although such a method increases the number of I/O connections, it cannot form complex conductive traces.

FIGS. 9A to 9C' show a conventional QFN semiconductor package 9 and a fabrication method thereof disclosed in U.S. Pat. No. 5,830,800 and No. 6,635,957. Referring to FIGS. 9A to 9C', a plurality of leads 913 is formed on a metal carrier 90 by electroplating, wherein the leads 913 may be made of Au//Pd/Ni/Pd or Pd/Ni/Au; then, a plurality of chips 93 is mounted on the leads and electrically connected to the leads through bonding wires 94, and an encapsulant 95 is formed; thereafter, the carrier 90 is removed and a dielectric layer 96 is formed on the bottom surface of the encapsulant 95 and has a plurality of openings 961 formed therein such that a plurality of solder balls 97 can be mounted on the leads 913 exposed from the openings 961. However, since the solder balls 97 have good wetting ability on a gold layer or a palladium layer but the bonding between the dielectric layer 96 and the gold layer or palladium layer is quite poor, solder material can easily permeate into the interface between the gold layer or palladium layer and the dielectric layer 96, thereby resulting in occurrence of solder extrusion 962 that prevents formation of solder balls and even causes short circuits between adjacent solder balls. As such, subsequent SMT processes are adversely affected, fabrication time and cost are increased and the product yield is decreased.

Therefore, it is imperative to overcome the above drawbacks of the prior art.

SUMMARY OF THE INVENTION

In view of the above drawbacks of the prior art, the present invention provides a method for fabricating a QFN semiconductor package, which comprises: providing a copper carrier and forming on the copper carrier a die pad and a plurality of I/O connections disposed at the periphery of the die pad; applying energy to the copper carrier, the die pad and the I/O connections so as to allow copper atoms to migrate and diffuse to the bottom surface of the die pad and the bottom surface of the I/O connections so as to form a surface layer; mounting a chip on the top surface of the die pad; electrically connecting the chip and the I/O connections through a plurality of bonding wires; forming an encapsulant on the copper carrier to encapsulate the die pad, the I/O connections, the chip and the bonding wires; removing the copper carrier to expose the surface layer; and forming a dielectric layer on a bottom surface of the encapsulant, the bottom surface of the die pad and the bottom surface of the I/O connections, the dielectric layer having a plurality of openings for exposing the surface layer.

According to the above-described method, the present invention further provides a QFN semiconductor package, which comprises: a die pad; a plurality of I/O connections disposed at the periphery of the die pad; a chip mounted on the top surface of the die pad; a plurality of bonding wires electrically connecting to the chip and the I/O connections; an encapsulant encapsulating the die pad, the I/O connections, the chip and the bonding wires while exposing the bottom surface of the die pad and the bottom surface of the I/O connections; a surface layer formed on the bottom surface of the die pad and the bottom surface of the I/O connections; and a dielectric layer formed on a bottom surface of the encapsulant and a bottom surface of the surface layer and having a plurality of openings for exposing the surface layer.

Therefore, by forming on the carrier the die pad and the plurality of I/O connections with conductive traces extending therefrom, the present invention meets the demands for conductive traces and increased number of I/O connections. Further, since the surface layer that is formed on the bottom surface of the die pad and the bottom surface of the I/O connections through migration and diffusion of metal atoms has good bonding with the dielectric layer, solder material in a reflow process can be prevented from permeating into the interface between the die pad, the I/O connections and the dielectric layer, thereby enhancing the product yield. In addition, the present invention forms the surface layer by applying energy to the copper carrier instead of utilizing an electroplating process or a sputtering process, thereby simplifying the fabrication process, reducing the fabrication time and cost.

BRIEF DESCRIPTION OF DRAWINGS

FIGS. 1 to 6 are schematic views showing a method for fabricating a QFN semiconductor package according to the present invention, wherein

DETAILED DESCRIPTION OF PREFERRED EMBODIMENTS

The following illustrative embodiments are provided to illustrate the disclosure of the present invention, these and other advantages and effects can be apparent to those in the art after reading this specification.

FIGS. 1 to 6 are schematic views showing a method for fabricating a QFN semiconductor package according to the present invention.

Figure 1A:
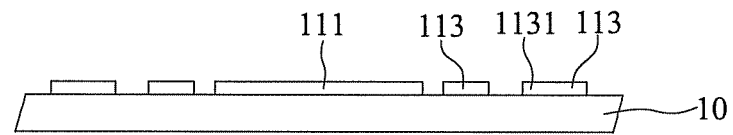
FIG. 1A is a cross-sectional view taken along a line 1A-1A in FIG. 1B.
Figure 1B:
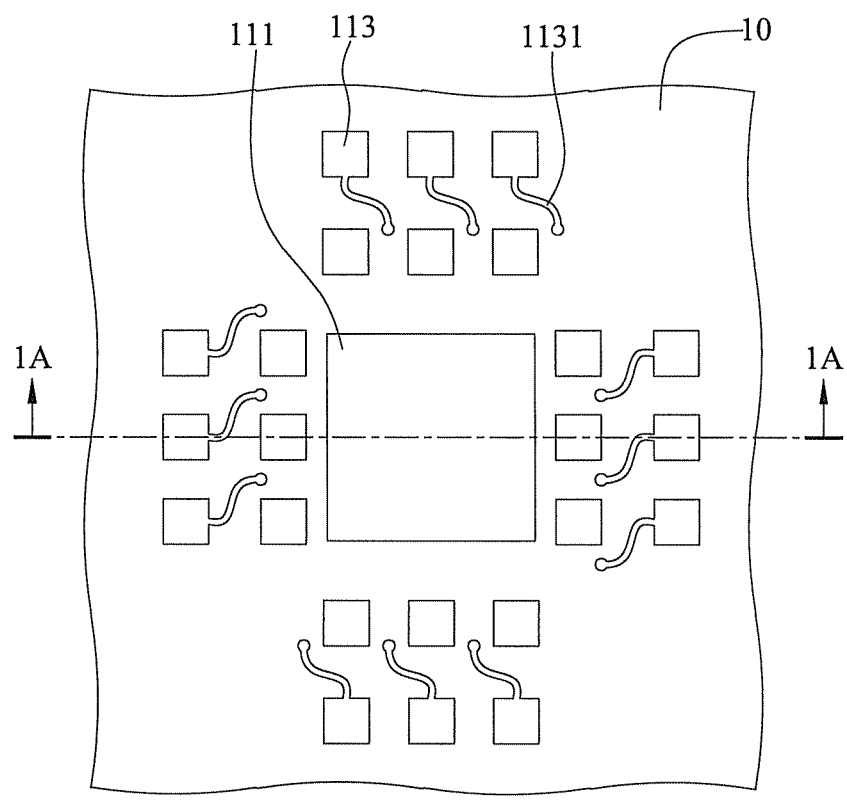

Referring to FIGS. 1A and 1B, a copper carrier 10 is prepared, on which a die pad 111 and a plurality of I/O connections 113 at the periphery of the die pad 111 are formed. Referring to FIG. 1B, preferably, at least a portion of the I/O connections 113 comprise conductive traces 1131 extending therefrom. The die pad 111 and the I/O connections 113 can be formed by electroplating, and made of one of Au/Pd/Ni/Pd, Au/Ni/Cu/Ni/Ag, Au/Ni/Cu/Ag, Pd/Ni/Pd, Au/Ni/Au and Pd/Ni/Au. Preferably, a gold layer or palladium layer is located at the bottom surface of the die pad 111 and the bottom surface of the I/O connections 113 (where the die pad 111 and the I/O connections 113 are in contact with the copper carrier 10).

Figure 2A:
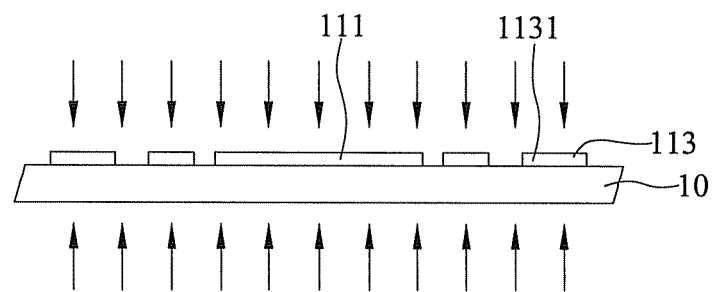
Figure 2B:
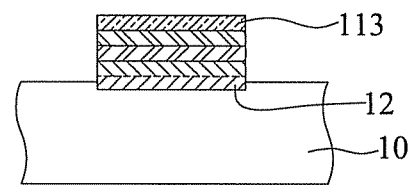
FIG. 2B is a partially enlarged view of FIG. 2A.

Further referring to FIG. 2A, thermal energy can be applied to the copper carrier 10, the die pad 111 and the I/O connections 113 so as to allow copper atoms to migrate and diffuse to the bottom surface of the die pad 111 and the bottom surface of the I/O connections 113 so as to form a surface layer 12 in the gold layer or palladium layer at the bottom surface of the die pad 111 and the bottom surface of the I/O connections 113. It should be noted that a portion of the atoms of the gold layer or palladium layer at the bottom surface of the die pad 111 and the bottom surface of the I/O connections 113 may also migrate towards the copper carrier 10. For example, as shown in FIG. 2B in the case the die pad 111 and the I/O connections 113 are made of Au/Pd/Ni/Pd, due to migration and diffusion of copper atoms, a surface layer 12 is formed at the bottom surface of a portion of the gold layer. Meanwhile, gold atoms or palladium atoms of the bottom surface of the die pad 111 and the bottom surface of the I/O connections 113 may also migrate and diffuse towards the copper carrier 10. As a result, the surface layer 12 may also be formed on a portion of the carrier 10 that is in contact with the die pad 111 and the I/O connections 113. In other embodiments, electric energy, light energy, magnetic energy, or ion beams may be applied for forming the surface layer.

Figure 2C:
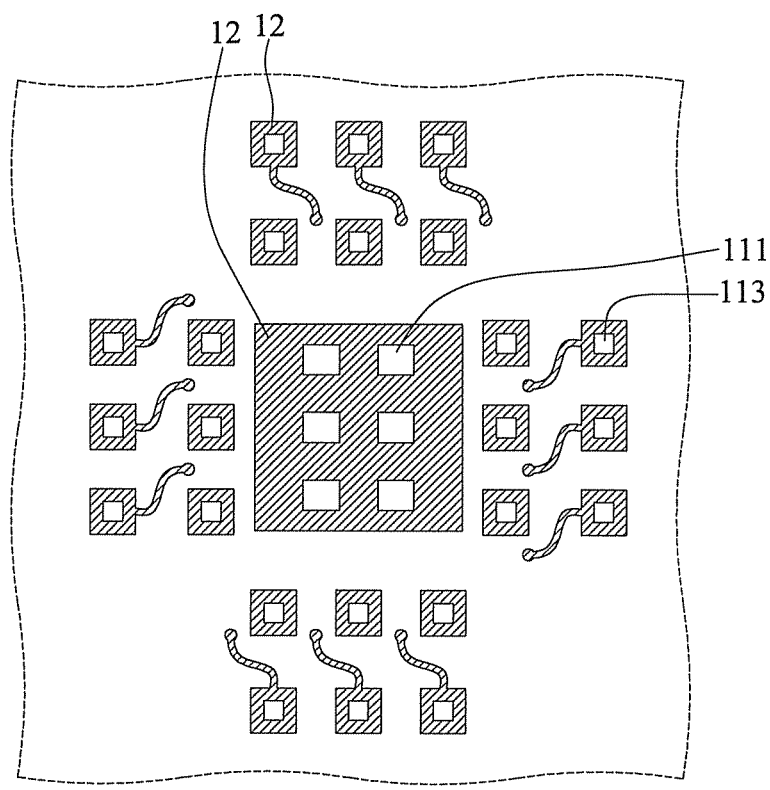
FIG. 2C is a bottom view of a carrier with a die pad and a plurality of I/O connections.

Further, the surface layer 12 fully or partially covers the bottom surface of the die pad 111 and the bottom surface of the I/O connections 113. FIG. 2C is a bottom view of the die pad and the I/O connections with a gold layer formed at the bottoms surface thereof. Referring to FIG. 2C, the surface layer 12 partially covers the gold layer of the die pad 111 and the I/O connections 113.

Figure 2D:
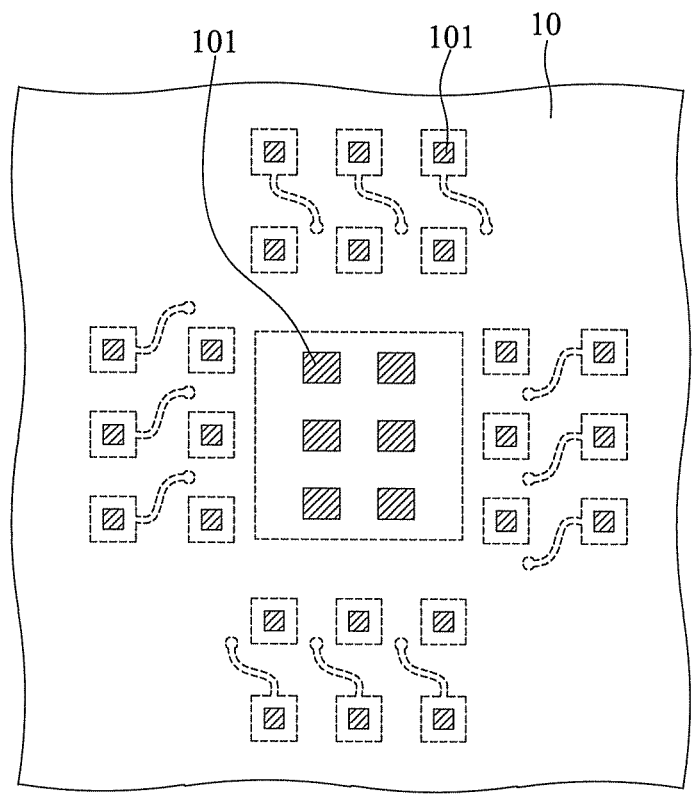
FIG. 2D is a top view of the carrier with a shielding pattern.

FIG. 2D is a top view of the carrier formed with a shielding pattern. Before the die pad 111 and the I/O connections 113 are formed, a shielding pattern 101 can be formed on the copper carrier 10 corresponding in position to the die pad 111, the I/O connections 113 and openings of a dielectric layer to be formed later so as to shield a portion of the surface of the copper carrier 10 and thereby prevent copper atoms from migrating into the shielded region.

Figure 3:
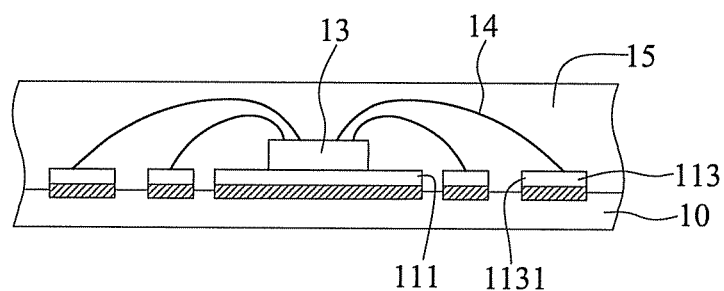

Referring to FIG. 3, a chip 13 is mounted on the top surface of the die pad 111 and electrically connected to the I/O connections 113 through a plurality of bonding wires 14. Thereafter, an encapsulant 15 is formed on the copper carrier 10 to encapsulate the die pad 111, the I/O connections 113, the chip 13, and the bonding wires 14.

Figure 4:
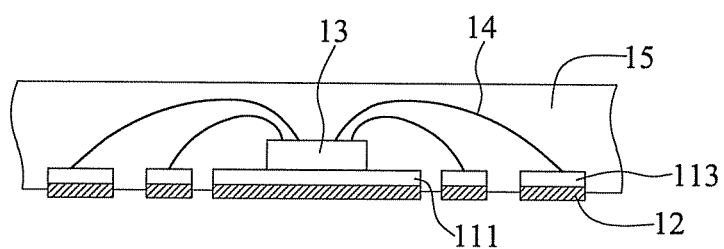

Referring to FIG. 4, the copper carrier 10 is removed by such as etching so as to expose the surface layer 12. Given the difference in the etching rate between the surface layer 12 and the copper carrier 10, the bottom surface of the encapsulant 15 is exposed from the surface layer 12.

Figure 5:
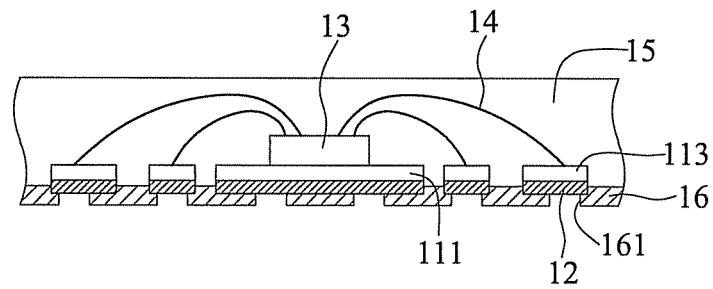

Referring to FIG. 5, a dielectric layer 16 is formed on the bottom surface of the encapsulant 15 and the bottom surface of the surface layer 12, and has a plurality of openings 161 formed for exposing the surface layer 12. Therein, the surface layer 12 prevents the die pad 111 and the I/O connections 113 from coming into contact with the dielectric layer 16.

Figure 6:
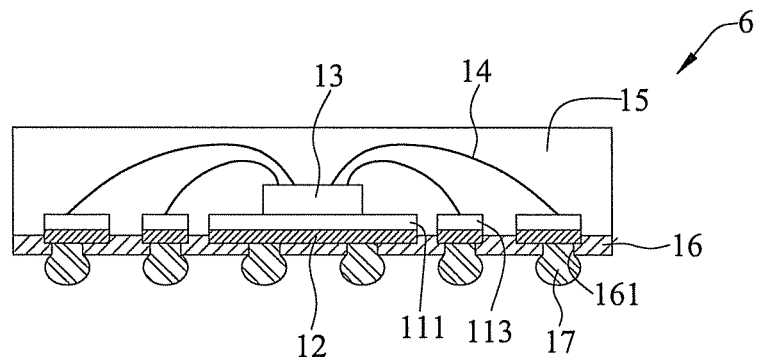

Referring to FIG. 6, a plurality of solder balls 17 is further formed in the openings 161 and a cutting process is performed to the encapsulant so as to obtain a QFN semiconductor package.

The present invention further provides a QFN semiconductor package 6, which comprises: a die pad 111, a plurality of I/O connections 113, a chip 13, a plurality of bonding wires 14, an encapsulant 15, a surface layer 12, and a dielectric layer 16 with a plurality of openings 161.

In an embodiment, the QFN semiconductor package further comprises a plurality of solder balls 17 formed in the openings 161 of the dielectric layer 16.

The I/O connections 113 are disposed at the periphery of the die pad 111. Preferably, at least a portion of the I/O connections 113 comprise conductive traces 1131 extending therefrom. The die pad 111 and the I/O connections 113 can be made of one or more selected from the group consisting of Au, Pd, Ag, Cu and Ni. For instance, the die pad 111 and the I/O connections 113 can be made of one of Au/Pd/Ni/Pd, Au/Ni/Cu/Ni/Ag, Au/Ni/Cu/Ag, Pd/Ni/Pd, Au/Ni/Au and Pd/Ni/Au. Preferably, a gold layer or a palladium layer is formed at the bottom surface of the die pad 111 and the bottom surface of the I/O connections 113.

The chip 13 is mounted on the top surface of the die pad 111. A plurality of bonding wires 14 electrically connect the chip 13 and the I/O connections 113. The encapsulant 15 encapsulates the die pad 111, the I/O connections 113, the chip 13, and the bonding wires 14 but exposes the bottom surface of the die pad 111 and the bottom surface of the I/O connections 113.

The surface layer 12 is formed on the bottom surface of the die pad 111 and the bottom surface of the I/O connections 113 through migration and diffusion of metal atoms. Further, the surface layer 12 may also be formed on a portion of the copper carrier 10 in contact with the bottom surface of the die pad 111 and the bottom surface of the I/O connections 113. The surface layer 12 is exposed from the bottom surface of the encapsulant 15. The dielectric layer 16 is formed on the bottom surface of the encapsulant 15 and the bottom surface of the surface layer 12 and has a plurality of openings 161 for exposing the surface layer 12.

In another embodiment, the surface layer 12 can fully or partially cover the bottom surface of the die pad 111 and the bottom surface of the I/O connections 113. For example, as shown in FIG. 2C, the surface layer 12 partially covers the bottom surface of the die pad 111 and the bottom surface of the I/O connections 113. In a preferred embodiment, the surface layer 12 is formed in a region where the dielectric layer 16 is to be formed to cover the die pad 111 and the I/O connections 113 while the region where the surface layer 12 is not formed corresponds to the openings of the dielectric layer 16. In other words, the surface layer 12 prevents the die pad 111 and the I/O connections 113 from coming into contact with the dielectric layer 16.

Figure 7:
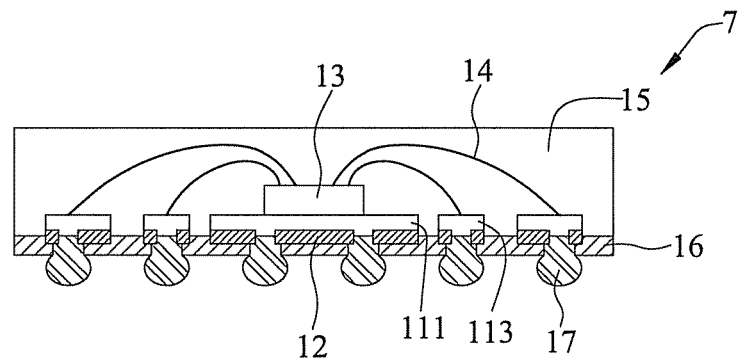
FIG. 7 is a cross-sectional view of a QFN semiconductor package according to another embodiment of the present invention.
Figure 8:
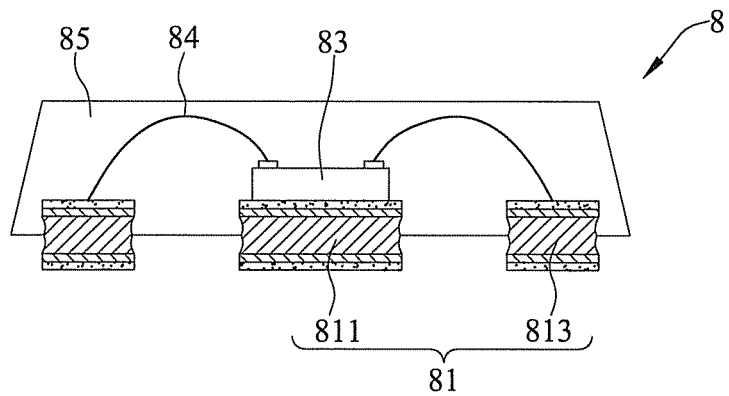
FIG. 8 is a cross-sectional view of a conventional QFN semiconductor package.
Figure 9A:
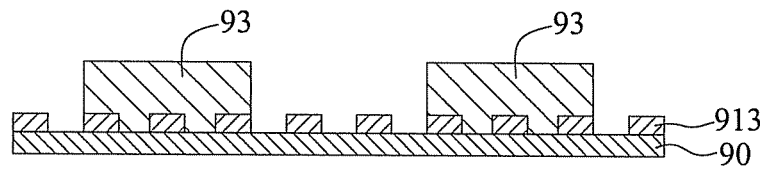
FIGS. 9A to 9C' are cross-sectional views showing a method for fabricating another conventional QFN semiconductor package, wherein FIG. 9C' is a partially enlarged view of FIG. 9C.
Figure 9B:
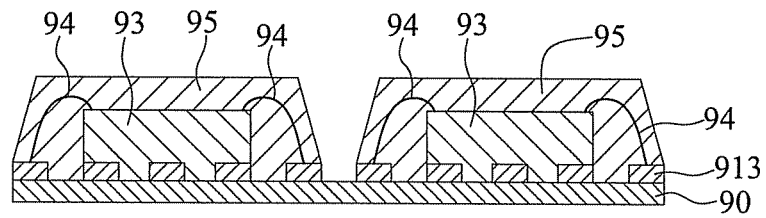
Figure 9C:
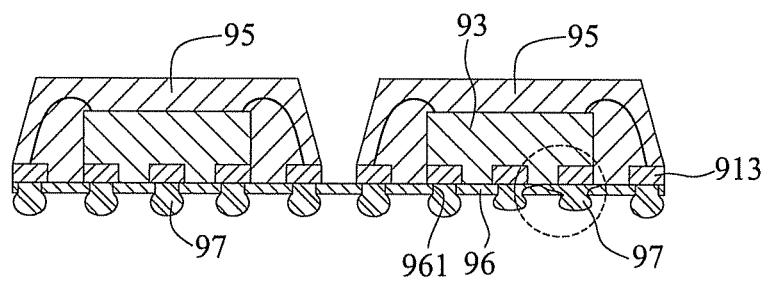
Figure 9C:
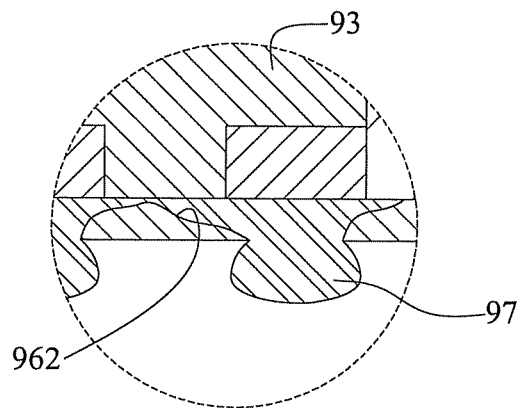

FIG. 7 shows another QFN semiconductor package according to another embodiment of the present invention. The present embodiment is similar to the above-described embodiment. The main difference between the present embodiment and the above-described embodiment is that, in the present embodiment, the surface layer 12 partially covers the bottom surface of the die pad 111 and the bottom surface of the I/O connections 113 such that the bottom surface of the die pad 111, the bottom surface of the I/O connections 113, the surface layer 12, and the dielectric layer 16 together form a stepped structure. In the present embodiment, the stepped structure forms strong bonding strength with the solder balls and meanwhile prevents solder material from permeating into the interface between the die pad, the I/O connections and the dielectric layer and avoid solder extrusion.

Therefore, since the surface layer that is formed on the bottom surface of the die pad and the bottom surface of the I/O connections through migration and diffusion of metal atoms has good bonding with the dielectric layer, solder material in a reflow process can be prevented from permeating into the interface between the die pad, the I/O connections and the dielectric layer, thereby enhancing the product yield. In addition, the present invention forms the surface layer by applying energy to the copper carrier instead of utilizing an electroplating process or a sputtering process, thus simplifying the fabrication process, reducing the fabrication time and costs.

The above-described descriptions of the detailed embodiments are intended to illustrate the preferred implementation according to the present invention, but it is not intended to limit the scope of the present invention, Accordingly, all modifications and variations completed by those with ordinary skill in the art should fall within the scope of present invention defined by the appended claims.

What is claimed is:

1. A QFN semiconductor package, comprising:
   a die pad;
   a plurality of I/O connections disposed at a periphery of the die pad;
   a chip mounted on a top surface of the die pad;
   a plurality of bonding wires for electrically connecting the chip and the I/O connections;
   an encapsulant for encapsulating the die pad, the I/O connections, the chip, and the bonding wires but exposing bottom surfaces of the I/O connections and a bottom surface of the die pad;
   a surface layer formed on the bottom surfaces of the I/O connections and the bottom surface of the die pad, wherein the surface layer partially covers the bottom surfaces of the I/O connections and the bottom surface of the die pad, such that the bottom surfaces of the I/O connections, the bottom surface of the die pad, and the surface layer together form a stepped structure; and
   a dielectric layer in contact with a bottom surface of the encapsulant and a bottom surface of the surface layer and having a plurality of openings for exposing the surface layer.

2. The package of claim 1, further comprising a plurality of solder balls electrically connecting to the surface layer exposed from the openings of the dielectric layer.

3. The package of claim 1, wherein the bottom surfaces of the I/O connections and that of the die pad are made of a gold layer or a palladium layer.

4. The package of claim 1, wherein at least a portion of the I/O connections comprise conductive traces extending therefrom.

5. The package of claim 1, wherein the surface layer comprises gold and copper or comprises palladium and copper.

6. The package of claim 1, wherein the stepped structure further includes the dielectric layer.

7. The package of claim 1, wherein the surface layer prevents the bottom surfaces of the I/O connections and the bottom surface of the die pad from coming into contact with the dielectric layer.

8. The package of claim 1, wherein the surface layer protrudes above the bottom surface of the encapsulant.

* * * * *